United States Patent
Kim et al.

(10) Patent No.: US 11,899,319 B2
(45) Date of Patent: Feb. 13, 2024

(54) THIN FILM TRANSISTOR SUBSTRATE INCLUDING MULTI-LEVEL TRANSPARENT ELECTRODES HAVING SLITS

(71) Applicant: LG Display Co., Ltd., Seoul (KR)

(72) Inventors: Do-Yeon Kim, Busan (KR); Byung-Sam Min, Goyang-si (KR); Jong-Hyun Kim, Jeju-si (KR)

(73) Assignee: LG Display Co., Ltd., Seoul (KR)

( * ) Notice: Subject to any disclaimer, the term of this patent is extended or adjusted under 35 U.S.C. 154(b) by 28 days.

(21) Appl. No.: 17/377,172

(22) Filed: Jul. 15, 2021

(65) Prior Publication Data

US 2021/0341803 A1    Nov. 4, 2021

Related U.S. Application Data

(63) Continuation of application No. 16/517,829, filed on Jul. 22, 2019, now Pat. No. 11,092,857, which is a
(Continued)

(30) Foreign Application Priority Data

Dec. 14, 2015    (KR) .......................... 10-2015-0177884

(51) Int. Cl.
  *H10K 50/81*    (2023.01)
  *H10K 50/82*    (2023.01)
  (Continued)

(52) U.S. Cl.
  CPC ...... *G02F 1/134309* (2013.01); *G02F 1/1368* (2013.01); *G02F 1/13439* (2013.01);
  (Continued)

(58) Field of Classification Search
  CPC ............... H01L 27/1214; H01L 27/124; H01L 27/3248; H01L 33/42; H01L 33/44;
  (Continued)

(56) References Cited

U.S. PATENT DOCUMENTS 6,144,435 A * 11/2000 Yokoyama ............ G02F 1/1345
                                                            349/122
6,577,368 B1    6/2003 Yuh et al.
(Continued)

FOREIGN PATENT DOCUMENTS

CN    101727858 A    6/2010
CN    101907802 A    12/2010
(Continued)

OTHER PUBLICATIONS

China National Intellectual Property Administration, First Notification of Office Action, CN Patent Application No. 201611059596.8, dated Feb. 6, 2020, 19 pages.
(Continued)

*Primary Examiner* — Ida M Soward

(74) *Attorney, Agent, or Firm* — Fenwick & West LLP

(57) ABSTRACT

Disclosed is a display device having a thin film transistor substrate, which may prevent afterimage and flicker defects by reducing the non-uniformity of an electric field. In the thin film transistor substrate, a pixel electrode includes a transparent edge electrode and a transparent inner electrode, which are spaced apart from each other with a first slit having a first width interposed therebetween, and a common electrode is exposed from the other-side end of the transparent edge electrode by a second width, which is smaller than the first width, in the width direction of a data line. As such, an inner area and an edge area in each sub pixel have uniform electric field distribution.

6 Claims, 4 Drawing Sheets

Related U.S. Application Data continuation of application No. 15/373,125, filed on Dec. 8, 2016, now Pat. No. 10,416,502.

(51) Int. Cl.
| | |
|---|---|
| *H10K 50/84* | (2023.01) |
| *H10K 59/12* | (2023.01) |
| *H10K 59/13* | (2023.01) |
| *G02F 1/13* | (2006.01) |
| *G02F 1/1343* | (2006.01) |
| *H01L 27/12* | (2006.01) |
| *G02F 1/1337* | (2006.01) |
| *G02F 1/1362* | (2006.01) |
| *G02F 1/1368* | (2006.01) |
| *G02F 1/1333* | (2006.01) |
| *H01L 33/44* | (2010.01) |
| *H01L 33/42* | (2010.01) |
| *G02F 1/1345* | (2006.01) |
| *H10K 50/814* | (2023.01) |
| *H10K 50/824* | (2023.01) |
| *H10K 50/828* | (2023.01) |
| *H10K 50/844* | (2023.01) |
| *H10K 59/123* | (2023.01) |
| *H10K 59/131* | (2023.01) |

(52) U.S. Cl.
CPC .. *G02F 1/133707* (2013.01); *G02F 1/134363* (2013.01); *G02F 1/136286* (2013.01); *H01L 27/1214* (2013.01); *G02F 1/1345* (2013.01); *G02F 1/133397* (2021.01); *G02F 1/134345* (2021.01); *G02F 1/134372* (2021.01); *G02F 2201/121* (2013.01); *G02F 2201/123* (2013.01); *G09G 2300/0465* (2013.01); *H01L 27/124* (2013.01); *H01L 33/42* (2013.01); *H01L 33/44* (2013.01); *H10K 50/814* (2023.02); *H10K 50/824* (2023.02); *H10K 50/828* (2023.02); *H10K 50/844* (2023.02); *H10K 59/123* (2023.02); *H10K 59/131* (2023.02); *H10K 59/1315* (2023.02)

(58) Field of Classification Search
CPC ............ H01L 51/5212; H01L 51/5228; H01L 51/5234; H01L 51/5253; G02F 1/134309; G02F 1/133707; G02F 1/134363; G02F 1/13439; G02F 1/136286; G02F 1/1368; G02F 1/133397; G02F 1/134345; G02F 1/134372; G02F 1/1345; G02F 1/1343; G02F 1/13686; G02F 2201/121; G02F 2201/123; G09G 2300/0421; G09G 2320/0204; G09G 2320/0247; G09G 2300/0465; G09G 2320/0257; H10K 50/824; H10K 50/814; H10K 50/828; H10K 50/844; H10K 59/123; H10K 59/131; H10K 59/1315

See application file for complete search history.

(56) References Cited

U.S. PATENT DOCUMENTS

| | | | |
|---|---|---|---|
| 7,190,421 B2 | 3/2007 | Hong et al. | |
| 7,430,032 B2 | 9/2008 | Hong | |
| 7,576,821 B2 | 8/2009 | Lee et al. | |
| 7,777,852 B2 | 8/2010 | Kawasaki et al. | |
| 7,834,354 B2 | 11/2010 | Lin et al. | |
| 8,045,123 B2 | 10/2011 | Kawamura et al. | |
| 8,288,771 B2 | 10/2012 | Lee et al. | |
| 8,379,177 B2 | 2/2013 | Jung et al. | |
| 8,455,277 B2 | 6/2013 | Lee et al. | |
| 8,476,093 B2 | 7/2013 | Lee et al. | |
| 8,669,600 B2 | 3/2014 | Park et al. | |
| 8,686,427 B2 | 4/2014 | Kim et al. | |
| 8,703,554 B2 | 4/2014 | Choi et al. | |
| 8,817,217 B2 | 8/2014 | Kwak | |
| 8,860,028 B2 | 10/2014 | Kwack | |
| 8,927,993 B2 | 1/2015 | Jung et al. | |
| 8,937,690 B2 | 1/2015 | Nam et al. | |
| 8,958,041 B2* | 2/2015 | Park ................... G02F 1/134363 349/139 |
| 8,964,155 B2* | 2/2015 | Ono ................... G02F 1/13458 349/141 |
| 9,013,419 B2 | 4/2015 | Wu et al. | |
| 9,040,344 B2 | 5/2015 | Choi et al. | |
| 9,040,365 B2 | 5/2015 | Beak et al. | |
| 9,097,951 B2* | 8/2015 | Cao ................... G02F 1/134363 |
| 9,134,580 B2 | 9/2015 | Nishida et al. | |
| 9,182,643 B1 | 11/2015 | Ge et al. | |
| 9,190,423 B2 | 11/2015 | Shin et al. | |
| 9,360,726 B2 | 6/2016 | Takizawa et al. | |
| 9,417,493 B2 | 8/2016 | Cao et al. | |
| 9,465,254 B2 | 10/2016 | Hisakabe et al. | |
| 9,543,324 B2 | 1/2017 | Yan et al. | |
| 9,570,473 B2 | 2/2017 | Wang | |
| 9,581,850 B2 | 2/2017 | Lee et al. | |
| 9,594,272 B2 | 3/2017 | Kajita | |
| 9,618,805 B2 | 4/2017 | Woo et al. | |
| 9,659,978 B2 | 5/2017 | Xu et al. | |
| 9,711,543 B2 | 7/2017 | Won et al. | |
| 9,759,958 B2 | 9/2017 | Choi et al. | |
| 9,773,819 B2 | 9/2017 | Cheng et al. | |
| 9,804,449 B2 | 10/2017 | Ono | |
| 9,817,503 B2 | 11/2017 | Lin et al. | |
| 9,874,795 B2 | 1/2018 | Choi et al. | |
| 9,880,438 B2 | 1/2018 | Ono et al. | |
| 10,014,329 B2 | 7/2018 | Bai et al. | |
| 10,146,084 B2 | 12/2018 | Yun et al. | |
| 10,663,820 B2 | 5/2020 | Duan et al. | |
| 2006/0108587 A1 | 5/2006 | Lee et al. | |
| 2008/0094554 A1 | 4/2008 | Sato et al. | |
| 2009/0066901 A1 | 3/2009 | Lin et al. | |
| 2009/0251628 A1 | 10/2009 | Lin | |
| 2010/0007837 A1 | 1/2010 | Ham et al. | |
| 2010/0053044 A1* | 3/2010 | Lee ................... H01L 51/5259 345/80 |
| 2010/0118236 A1 | 5/2010 | Kim et al. | |
| 2010/0238392 A1 | 9/2010 | Kim et al. | |
| 2010/0245220 A1 | 9/2010 | Hsu et al. | |
| 2011/0049519 A1 | 3/2011 | Kim et al. | |
| 2011/0181805 A1 | 7/2011 | Nagami | |
| 2011/0211145 A1 | 9/2011 | Tsuruma et al. | |
| 2011/0234959 A1 | 9/2011 | Ochiai et al. | |
| 2011/0244751 A1 | 10/2011 | Choi et al. | |
| 2012/0075563 A1 | 3/2012 | Takeda et al. | |
| 2012/0169984 A1 | 7/2012 | Jang et al. | |
| 2012/0171793 A1 | 7/2012 | Lee et al. | |
| 2012/0280237 A1* | 11/2012 | Kwack ................... H01L 27/127 438/157 |
| 2013/0016294 A1 | 1/2013 | Li et al. | |
| 2013/0063673 A1 | 3/2013 | Choi et al. | |
| 2013/0258255 A1 | 10/2013 | Fang | |
| 2014/0054581 A1 | 2/2014 | Song et al. | |
| 2014/0139796 A1 | 5/2014 | Cao et al. | |
| 2014/0167031 A1* | 6/2014 | Choi ................... H01L 21/02565 257/43 |
| 2014/0248732 A1 | 9/2014 | Kim et al. | |
| 2014/0285478 A1 | 9/2014 | Ono | |
| 2014/0340622 A1 | 11/2014 | Ono | |
| 2015/0049128 A1 | 2/2015 | Iwata et al. | |
| 2015/0077692 A1 | 3/2015 | Kim et al. | |
| 2015/0090980 A1 | 4/2015 | Lee et al. | |
| 2015/0092132 A1* | 4/2015 | Kang ................... H01L 27/124 438/34 |
| 2015/0198837 A1 | 7/2015 | Kim et al. | |
| 2015/0234215 A1 | 8/2015 | Kim et al. | |
| 2015/0243681 A1* | 8/2015 | Sung ................... H01L 27/124 438/151 |
| 2015/0303123 A1 | 10/2015 | Choi et al. | |
| 2016/0027800 A1 | 1/2016 | Liu | |

(56) References Cited

U.S. PATENT DOCUMENTS

| | | |
|---|---|---|
| 2016/0062197 A1 | 3/2016 | Huang et al. |
| 2016/0062203 A1 | 3/2016 | Ono et al. |
| 2016/0200978 A1 | 7/2016 | Bae et al. |
| 2016/0202579 A1 | 7/2016 | Kim et al. |
| 2016/0225794 A1 | 8/2016 | Wang et al. |
| 2016/0276377 A1 | 9/2016 | Sun |
| 2016/0370661 A1 | 12/2016 | Ono |
| 2016/0372499 A1* | 12/2016 | Choi .................. H01L 21/77 |
| 2017/0038629 A1 | 2/2017 | Joo et al. |
| 2017/0060317 A1 | 3/2017 | Kim et al. |
| 2017/0205667 A1 | 7/2017 | Suh et al. |
| 2018/0120610 A1* | 5/2018 | Ono .................. G02F 1/134363 |
| 2018/0233518 A1 | 8/2018 | Qing et al. |
| 2019/0064618 A1 | 2/2019 | Ono |
| 2019/0146287 A1 | 5/2019 | Matsushima |
| 2020/0201469 A1 | 6/2020 | Oh et al. |
| 2020/0319491 A1 | 10/2020 | Shin et al. |

FOREIGN PATENT DOCUMENTS

| | | | | |
|---|---|---|---|---|
| CN | 101957527 A | | 1/2011 | |
| CN | 102790012 A | * | 11/2012 | ....... G02F 1/134363 |
| CN | 102998856 A | | 3/2013 | |
| CN | 103855087 A | * | 6/2014 | ....... G02F 1/134363 |
| CN | 104246588 A | | 12/2014 | |
| JP | 2009-069332 A | | 4/2009 | |
| JP | 2011-017891 A | | 1/2011 | |
| JP | 2011-164471 A | | 8/2011 | |
| JP | 2012-073421 A | | 4/2012 | |
| JP | 2013-127558 A | | 6/2013 | |
| JP | 2014-228565 A | | 12/2014 | |
| JP | 2015028666 A | * | 2/2015 | ....... G02F 1/133345 |
| KR | 10-2002-0056702 A | | 7/2002 | |
| KR | 10-2006-0050008 A | | 6/2006 | |
| KR | 10-2008-0071042 A | | 8/2008 | |
| KR | 20120015162 A | * | 2/2012 | ........... G02F 1/1343 |
| KR | 10-2013-0075528 A | | 7/2013 | |
| KR | 10-2014-0090857 A | | 7/2014 | |

OTHER PUBLICATIONS

German Patent and Trademark Office, Office Action, DE Patent Application No. 1 O 2016 122 991.1, dated Oct. 25, 2019, 14 pages.

Korean Intellectual Property Office, Notification of Reason for Refusal, KR Patent Application No. 10-2015-0177884, dated Mar. 12, 2020, nine pages.

Korean Intellectual Property Office, Office Action, KR Patent Application No. 10-2015-0177884, dated Oct. 8, 2019, 12 pages.

United States Office Action, U.S. Appl. No. 15/373,125, dated Jan. 14, 2019, ten pages.

United States Office Action, U.S. Appl. No. 15/373,125, dated Oct. 11, 2018, nine pages.

United States Office Action, U.S. Appl. No. 15/373,125, dated Oct. 11, 2017, nine pages.

United States Office Action, U.S. Appl. No. 16/517,829, dated Apr. 8, 2021, eight pages.

United States Office Action, U.S. Appl. No. 16/517,829, dated Jan. 12, 2021, nine pages.

United States Office Action, U.S. Appl. No. 16/517,829, dated Aug. 27, 2020, 11 pages.

United States Office Action, U.S. Appl. No. 16/517,829, dated Jun. 2, 2020, eight pages.

* cited by examiner

REALTED ART

REALTED ART

REALTED ART

THIN FILM TRANSISTOR SUBSTRATE INCLUDING MULTI-LEVEL TRANSPARENT ELECTRODES HAVING SLITS

This application is a continuation of U.S. patent application Ser. No. 16/517,829 filed on Jul. 22, 2019 which is a continuation of U.S. patent application Ser. No. 15/373,125 filed on Dec. 8, 2016, which claims the benefit of Republic of Korea Patent Application No. 10-2015-0177884, filed on Dec. 14, 2015, all of which are incorporated by reference in their entirety for all purposes as if fully set forth herein.

BACKGROUND OF THE INVENTION

Field of the Invention

The present invention relates to a display device and a method of manufacturing the same, and more particularly, to a thin film transistor substrate of a display device with improved display quality.

Discussion of the Related Art

A Liquid Crystal Display (LCD) is a display apparatus that acquires a desired image signal by applying an electric field to a liquid crystal layer, which is introduced between a Thin Film Transistor (TFT) substrate and a color filter substrate and has anisotropic dielectric permittivity, and by controlling the quantity of light transmitted through the substrates by adjusting the strength of the electric field.

Examples of liquid crystal displays include an In-Plane Switching (IPS) liquid crystal display, which uses a horizontal electric field, and a Fringe Field Switching (FFS) liquid crystal display, which uses a fringe field.

Among these, the FFS liquid crystal display creates a fringe field by reducing the distance between a common electrode and a pixel electrode to be smaller than the distance between a thin film transistor substrate and a color filter substrate. The fringe field operates not only liquid crystal molecules between the common electrode and the pixel electrodes, but also liquid crystal molecules on both the pixel electrodes and the common electrode, which results in an improved aperture ratio and transmittance.

In the FFS liquid crystal display, as illustrated in FIG. 1, pixel electrodes 22 and a common electrode 24 are spaced apart from each other with a slit interposed therebetween. At this time, the distance between the pixel electrodes 22, which are located in each sub-pixel, differs from the distance between the pixel electrodes 22, which are located in respective sub-pixels on opposite sides of a data line 20 therebetween. As such, the length of an alignment layer 26, which is located in the inner area A1 between the pixel electrodes 22 located in each sub-pixel, differs from the length of the alignment layer 26, which is located in the edge area A2 between the pixel electrodes 22 located in the respective sub-pixels on opposite sides of the data line 20 therebetween. In this way, there occurs a difference in the resistance of the alignment layer 26 between the inner area A1 and the edge area A2, and in turn, the difference in the resistance of the alignment layer 26 causes different residual DC components between the inner area A1 and the edge area A2, resulting in the nonuniform electric fields of the respective areas.

Specifically, when the liquid crystal display is driven for a long time, or a unidirectional (positive or negative) electric field is applied to the liquid crystal layer for a long time, the electric field deviates upward or downward on the basis of a common voltage, and dopants in the liquid crystal layer are ionized to thereby become adsorbed on the alignment layer 26. That is, positive ions are absorbed on the alignment layer 26 that corresponds to a minus (−) electrode, and negative ions are adsorbed on the alignment layer 26 that corresponds to a plus (+) electrode. As the ions adsorbed on the alignment layer 26 are diffused to the liquid crystal layer, a residual DC voltage is generated. The residual DC voltage rearranges liquid crystal molecules of the liquid crystal layer even though no DC voltage is applied to the liquid crystal layer. Thereby, even when a new DC voltage is applied to the liquid crystal layer between the pixel electrodes and the common electrode in order to implement image transition, there occurs an afterimage defect whereby a previous image formed by the residual DC voltage remains. In particular, as illustrated in FIG. 2, because a higher residual DC voltage is generated in the edge area A2 in which the alignment layer 26 has a relatively long length than in the inner area A1, the electric fields of the inner area A1 and the edge area A2 become different from each other, and the afterimage defect is noticeable in the edge area A2.

In addition, a flicker defect, whereby momentary screen shaking is caused for approximately a few seconds, occurs until the residual DC voltage dissipates. At this time, as illustrated in FIG. 3, because the residual DC component in the inner area A1 almost completely dissipates after a time T1, the flicker defect occurs during the time T1. In addition, because the residual DC component in the edge area A2 in which the length of the alignment layer 26 is longer than in the inner area A1, dissipates after a time T2, which is later than the time T1 in the inner area A1, the flicker defect occurs during the time T2.

SUMMARY

Accordingly, the present invention is directed to a display device and a method of manufacturing the same that substantially obviate one or more problems due to limitations and disadvantages of the related art.

An advantage of the present invention is to provide a thin film transistor substrate of a display device with improved display quality.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device having a thin film transistor substrate may, for example, include a gate line and a data line crossing each other to define a pixel region on the thin film transistor substrate; a pixel electrode in the pixel region, the pixel electrode having a transparent edge electrode and a transparent inner electrode spaced apart from one side end of the transparent edge electrode with a first slit having a first width interposed therebetween; and a common electrode exposed from another side end of the transparent edge electrode by a second width in a width direction of the data line, wherein a ratio of the second width and the first width is within a range from 0.1 to 0.74.

In addition, in a display device in accordance with a first embodiment of the present invention further includes a floating conductive layer disposed in the same plane as the pixel electrode to overlap a data line.

In addition, in a display device in accordance with a second embodiment of the present invention, a common electrode includes a second slit located in an area overlapping a data line, and the other-side end of the common electrode exposed by the second slit is spaced apart from the other-side end of the transparent edge electrode by the second width.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Hereinafter, embodiments of the present invention will be described in detail with reference to the accompanying drawings.

Figure 1:
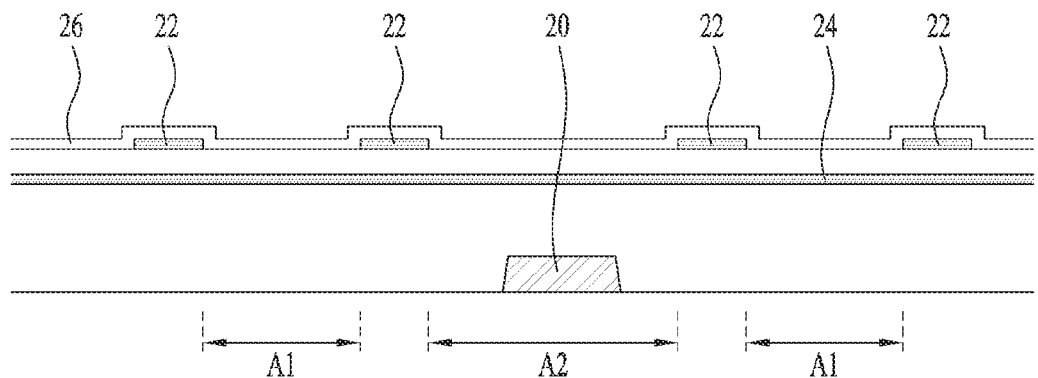
FIG. 1 is a sectional view illustrating a conventional thin film transistor substrate.
Figure 2:
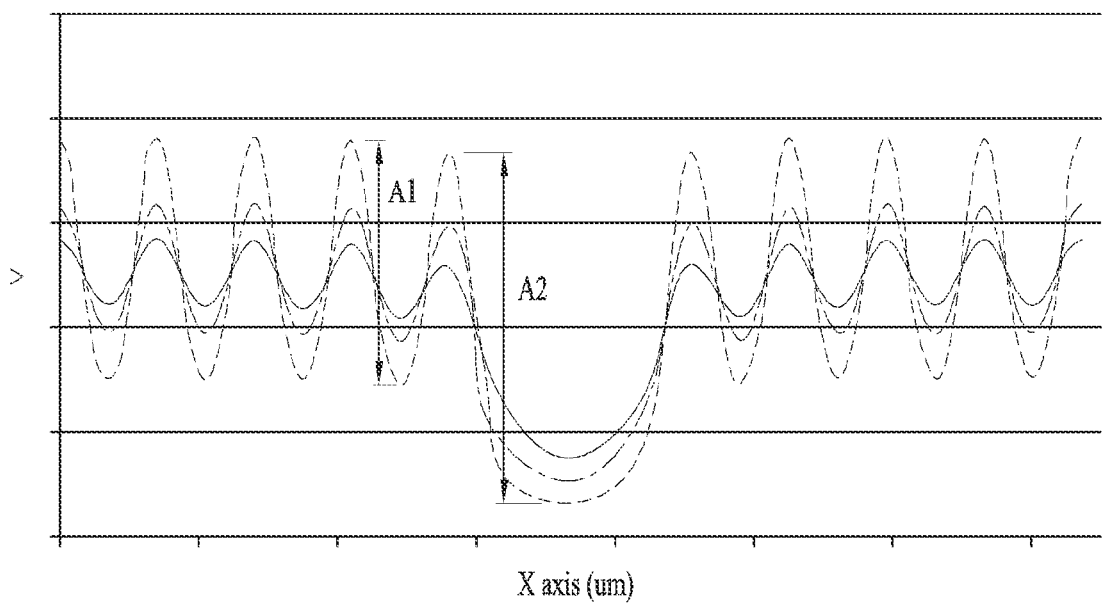
FIG. 2 is a view illustrating residual DC quantity depending on the difference in the distance between pixel electrodes illustrated in FIG. 1.
Figure 3:
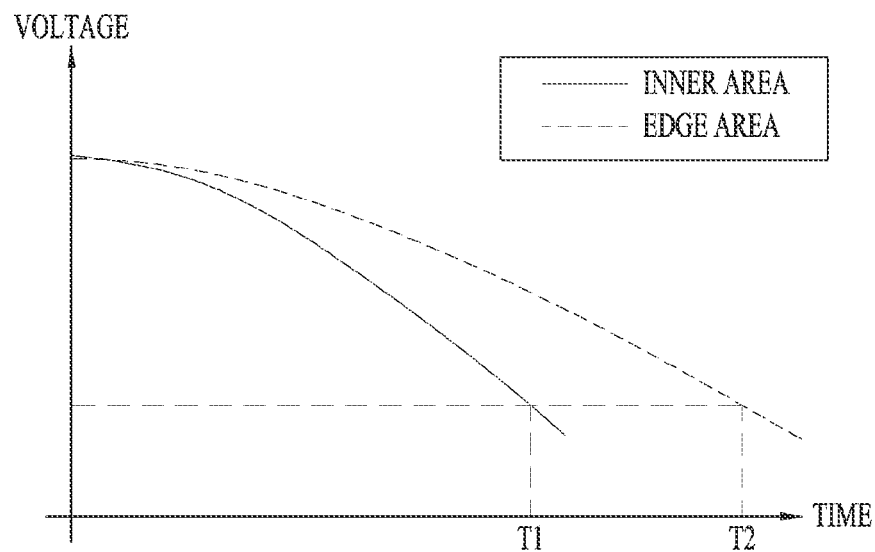
FIG. 3 is a view illustrating the dissipation of residual DC component in the thin film transistor substrate illustrated in FIG. 1.
Figure 4:
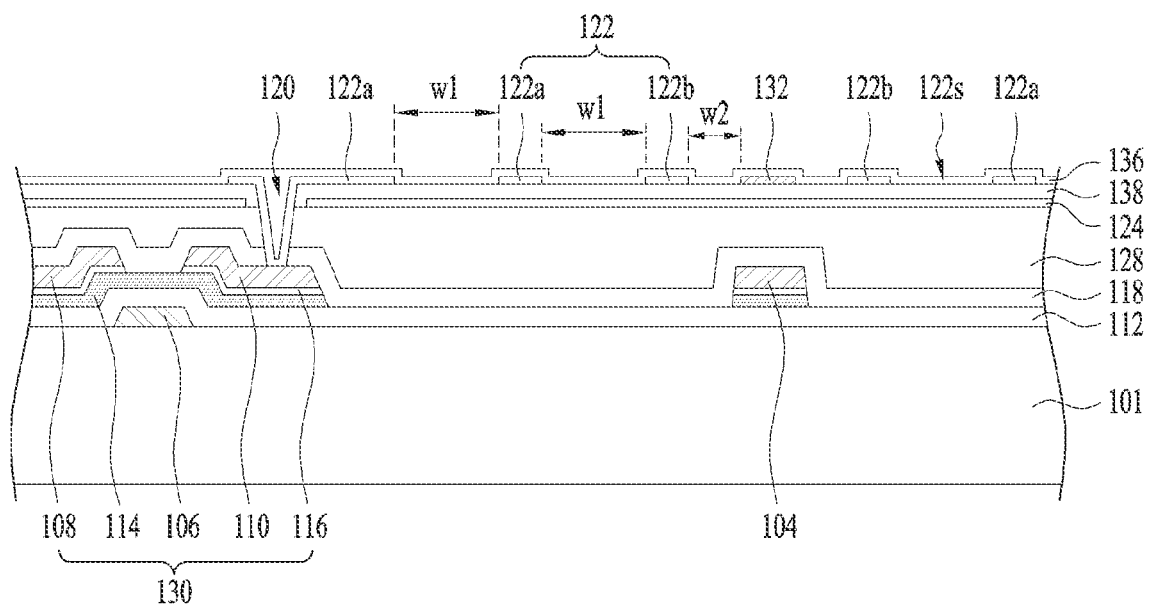
FIG. 4 is a sectional view illustrating a thin film transistor substrate in accordance with a first embodiment of the present invention.

FIG. 4 is a sectional view illustrating a thin film transistor substrate in accordance with a first embodiment of the present invention.

The thin film transistor substrate illustrated in FIG. 4 includes a thin film transistor 130, a pixel electrode 122 connected to the thin film transistor 130, a common electrode 124 for creating the fringe field in a pixel area in cooperation with the pixel electrode 122, and a floating conductive layer 132 overlapping a data line 104.

The thin film transistor 130 is formed at the intersection of a gate line and the data line 104. The thin film transistor 130 charges the pixel electrode 122 with a video signal of the data line 104 in response to a scan signal of the gate line. To this end, the thin film transistor 130 includes a gate electrode 106, a source electrode 108, a drain electrode 110, an active layer 114, and an ohmic contact layer 116.

The gate electrode 106 overlaps a channel of the active layer 114 with a gate insulation layer 112 interposed therebetween. The gate electrode 106 may be a single layer or multiple layers formed on a substrate 101 using any one selected from among molybdenum (Mo), aluminum (Al), chrome (Cr), gold (Au), titanium (Ti), nickel (Ni), neodymium (Nd), and copper (Cu) or alloys thereof, without being limited thereto. A gate signal is supplied to the gate electrode 106 through the gate line.

The active layer 114 is formed on the gate insulation layer 112 to overlap the gate electrode 106, thereby forming a channel between the source and drain electrodes 108 and 110. The ohmic contact layer 116 is formed on the area of the active layer 114 excluding the channel in order to realize ohmic contact between each of the source and drain electrodes 108 and 110 and the active layer 114. The active layer 114 and the ohmic contact layer 116 are formed to overlap not only the source and drain electrodes 108 and 110, but also the data line 104.

The source electrode 108 may be a single layer or multiple layers formed on the ohmic contact layer 116 using any one selected from among molybdenum (Mo), aluminum (Al), chrome (Cr), gold (Au), titanium (Ti), nickel (Ni), neodymium (Nd), and copper (Cu) or alloys thereof, without being limited thereto. A video signal is supplied to the source electrode 108 through the data line 104.

The drain electrode 110 faces the source electrode 108 with the channel interposed therebetween, and is formed of the same material as the source electrode 108. The drain electrode 110 is exposed through a pixel contact hole 120, which penetrates a first protective layer 118, a planarization layer 128, and a second protective layer 138, thereby being electrically connected to the pixel electrode 122.

The floating conductive layer 132 is disposed above the common electrode 124 to overlap the data line 104. More particularly, the floating conductive layer 132 is formed on the second protective layer 138 in the same plane as the pixel electrode 122 using the same transparent conductive material as the pixel electrode 122. As such, the floating conductive layer 132 and the pixel electrode 122 may be formed at the same time via the same masking process, which may prevent the implementation of an additional masking process and an increase in cost. No electrical signal from an external source is applied to the floating conductive layer 132.

The common electrode 124 is formed in each sub-pixel area and receives a common voltage through a common line. As such, the common electrode 124, to which the common voltage is supplied, creates the fringe field in cooperation with the pixel electrode 122, to which the video signal is supplied through the thin film transistor 130.

Figure 5:
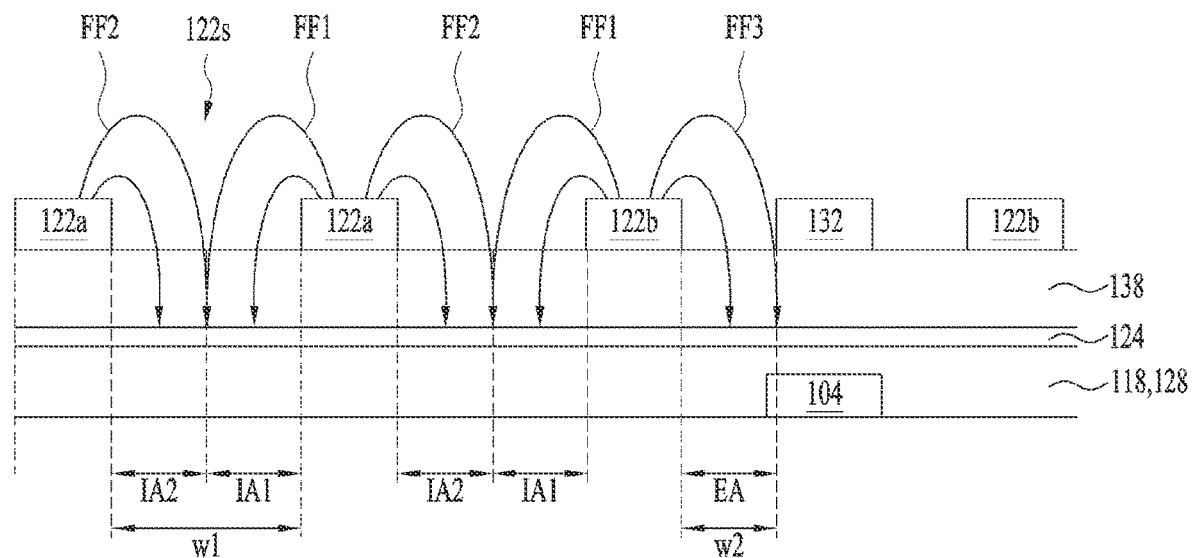
FIG. 5 is a sectional view illustrating the fringe field between pixel electrodes and a common electrode, illustrated in FIG. 4, on a per position basis.

The pixel electrode 122 is connected to the drain electrode 110 exposed through the pixel contact hole 120. The pixel electrodes 122 of respective sub-pixels include transparent edge electrodes 122b located close to the data line 104, and transparent inner electrodes 122a located between the transparent edge electrodes 122b. Each of the transparent inner electrodes 122a is spaced apart from the adjacent transparent inner electrode 122a or the adjacent transparent edge electrode 122b with a first slit 122s having a first width w1 interposed therebetween. As illustrated in FIG. 5, the first fringe field FF1 is generated in a first inner area IA1 between one-side end of the transparent inner electrode 122a and the common electrode 124, and the second fringe field FF2, which has a similar potential to that of the first inner area IA1 is generated in a second inner area IA2 between the other-side end of the transparent inner electrode 122a and the common electrode 124. At this time, each first slit 122s has the first width w1 to allow the outermost end point of the first fringe field FF1, generated in the first inner area IA1, and the outermost end point of the second fringe field FF2, generated in the second inner area IA2, to coincide or overlap with each other.

In addition, because the transparent edge electrode 122b is spaced apart from the floating conductive layer 132 by a second width w2, which is smaller than the first width w1, the common electrode 124 is exposed from the other-side end of the transparent edge electrode 122b by the second width w2 in the width direction of the data line 104. Here, the ratio of the second width w2 and the first width w1 is within the range from 0.1 to 0.5. Accordingly, because each of the first and second inner areas IA1 and IA2 and an edge area EA have similar surface-areas, the length of an alignment layer 136 in the edge area EA is similar to that of each of the first and second inner areas IA1 and IA2.

Thereby, because there occurs no difference in the resistance of the alignment layer 136 between the first and second inner areas IA1 and IA2 and the edge area EA, a third fringe field FF3 generated in the edge area EA has potential similar to that of each of the first and second inner areas IA1 and IA2. In this way, the first and second inner areas IA1 and IA2 and the edge area EA have similar residual DC components, and consequently, take the same amount of time to dissipate the residual DC components. That is, the residual DC component in the edge area EA is reduced compared to the related art to be similar to that in each of the first and second inner areas IA1 and IA2, which ensures more rapid dissipation of the residual DC component than in the related art. As a result, the present invention may prevent afterimage and flicker defects attributable to the nonuniformity of the electric field.

Figure 6:
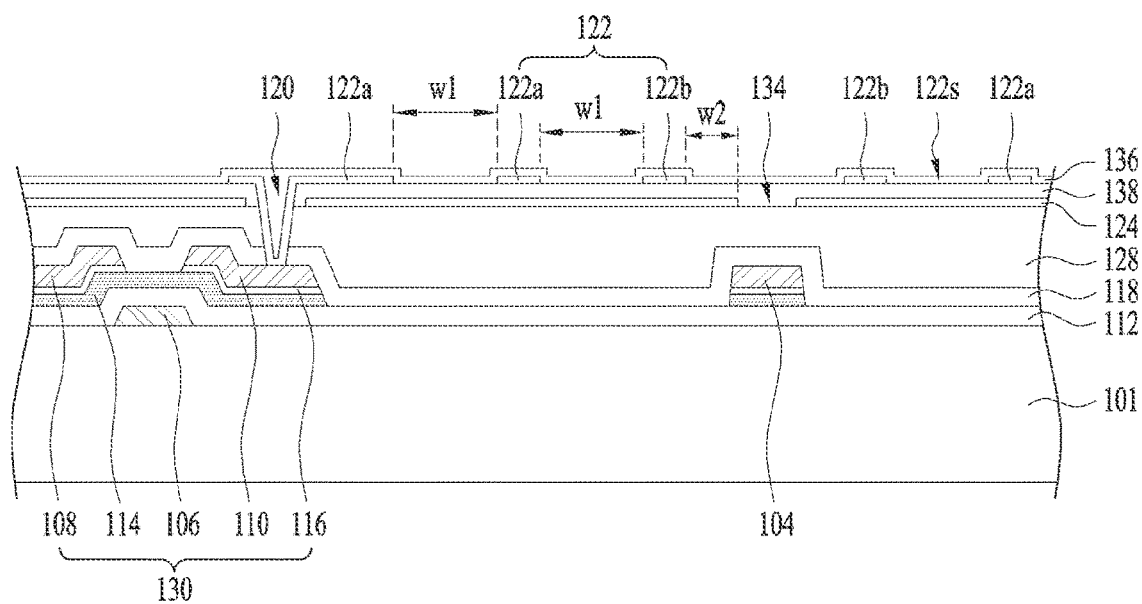
FIG. 6 is a sectional view illustrating a thin film transistor substrate in accordance with a second embodiment of the present invention.

FIG. 6 is a sectional view illustrating a thin film transistor substrate in accordance with a second embodiment of the present invention.

The thin film transistor substrate illustrated in FIG. 6 includes the same constituent elements as the thin film transistor substrate illustrated in FIG. 4 except that the floating conductive layer is replaced with the common electrode 124 having a second slit 134 otherwise known as "a gap". Thus, a detailed description related to the same constituent elements will be omitted.

Figure 7:
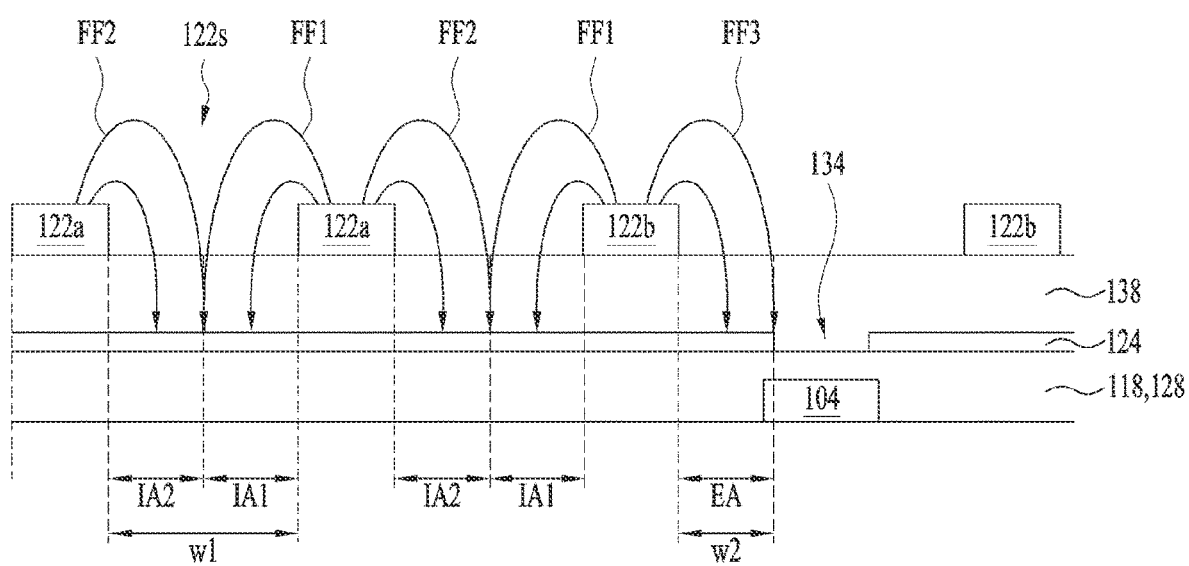
FIG. 7 is a sectional view illustrating the fringe field between pixel electrodes and a common electrode, illustrated in FIG. 6, on a per position basis.

The common electrode 124 includes a second slit 134 located in the area overlapping the data line 104. Due to the second slit 134, the common electrode 124 in each sub-pixel area protrudes toward the data line 104 than does the pixel electrode 122. Because the common electrode 124 is exposed from the other-side end of the transparent edge electrode 122b by the second width w2 in the width direction of the data line 104, the other-side end of the common electrode 124 exposed by the second slit 134 is spaced apart from the other-side end of the transparent edge electrode 122b by the second width w2. As such, as illustrated in FIG. 7, the first fringe field 1-1-1 is generated in the first inner area IA1 between one-side end of the transparent edge electrode 122b or the one-side end of the transparent inner electrode 122a, and the common electrode 124. The second fringe field FF2 is generated in the second inner area IA2 between other-side end of the transparent inner electrode 122a, and the common electrode 124. And, the third fringe field 1-1-3, which has a similar potential to that of each of the first and second inner areas IA1 and IA2, is generated in the edge area EA between the other-side end of the transparent edge electrode 122b and the common electrode 124.

At this time, the ratio of the second width w2 of the first slit 122s and the first width w1 of the common electrode 124 is set so that the residual DC component of the inner area IA and the residual DC component of the edge area EA, are similar to each other. For example, the second width w2 of the common electrode 124, which protrudes beyond the transparent edge electrode 122b, is smaller than the first width w1 of the first slit 122s, and the ratio of the second width w2 of the first slit 122s and the first width w1 of the common electrode 124 is within the range from 0.1 to 0.74. So long as this ratio is satisfied, the residual DC quantity of the inner areas IA1 and IA2 and the residual DC quantity of the edge area EA are similar to each other. That is, when the ratio of the second width w2 of the first slit 122s and the first width w1 of the common electrode 124 is within the range from 0.1 to 0.74, it can be appreciated as shown in table 1 that the inner areas IA1 and IA2 and the edge area EA have similar residual DC component, causing uniform distribution of the electric field in the inner areas IA1 and IA2 and the edge area EA. On the other hand, when the ratio exceeds 0.74, it can be appreciated as shown in table 1 that the residual DC component of the edge area EA becomes greater than the residual DC component of the inner areas IA1 and IA2, causing non-uniform distribution of the electric field in the inner areas IA1 and IA2 and the edge area EA.

TABLE 1

| The ratio of the second width w2 and the first width w1 | The residual DC quantity of the inner area | The residual DC quantity of the edge area |
| --- | --- | --- |
| 0.64 | 2.39 | 2.35 |
| 0.74 |  | 2.42 |
| 0.85 |  | 2.46 |
| 1.00 |  | 2.50 |
| 1.17 |  | 5.53 |

As described above, because the first and second inner areas IA1 and IA2 and the edge area EA have similar electric field distributions in the second embodiment of the present invention, the first and second inner areas IA1 and IA2 and the edge area EA have the same residual DC component, and thus take the same amount of time to dissipate the residual DC component. That is, the residual DC component of the edge area EA is reduced compared to the related art to be similar to that of each of the first and second inner areas IA1 and IA2, which ensures more rapid dissipation of the residual DC component than in the related art. As a result, an embodiment of the present invention may prevent afterimage and flicker defects attributable to the non-uniformity of the electric field.

Meanwhile, although an embodiment of the present invention describes the configuration in which the pixel electrode 122 (i.e. a transparent upper electrode) is disposed above the common electrode 124 (i.e. a transparent lower electrode) by way of example, alternatively, the common electrode may be disposed above the pixel electrode. In addition, although an embodiment of the present invention describes the configuration in which the first slit 122s is arranged parallel to the data line 104 by way of example, alternatively, the first slit 122s may be arranged parallel to a gate line. In this case, the transparent edge electrode 122b is located close to the gate line.

As is apparent from the above description, according to an embodiment of the present invention, first and second inner areas and an edge area, which are located in each sub-pixel, have similar electric field distributions. Thereby, according to an embodiment of the present invention, the first and second inner areas and the edge area have the same residual DC component, and take the same amount of time to dissipate the residual DC component, which may prevent afterimage and flicker defects attributable to the nonuniformity of the electric field.

It will be apparent to those skilled in the art that the present invention described above is not limited to the embodiments described above and the accompanying drawings, and various substitutions, modifications, and alterations may be devised within the spirit and scope of the present invention.

What is claimed is:

1. A display device having a thin film transistor substrate, the thin film transistor substrate comprising:
    a data line;
    a transparent upper electrode that is non-overlapping with the data line, the transparent upper electrode including a transparent first electrode, at least two transparent second electrodes and a first slit disposed between the at least two transparent second electrodes, the transparent first electrode closer to the data line than the at least two transparent second electrodes; and
    a transparent lower electrode including a second slit that overlaps the data line.

2. The display device of claim 1, wherein the transparent lower electrode includes a portion that extends past a side of the transparent first electrode towards the second slit.

3. The display device of claim 2, wherein a width of the portion of the transparent lower electrode that extends past the side of the transparent first electrode is narrower than a width of the first slit.

4. The display device of claim 3, wherein a ratio of the width of the portion to the width of the first slit is in a range from 0.1 to 0.74.

5. The display device of claim 1, wherein the transparent first electrode extends in a direction along the data line.

6. The display device of claim 5, wherein the at least two transparent second electrodes extends in the direction along the data line and is farther away from the data line than the transparent first electrode.

* * * * *